United States Patent
Liu et al.

(10) Patent No.: US 12,027,547 B2
(45) Date of Patent: Jul. 2, 2024

(54) SOLID-STATE IMAGE SENSOR

(71) Applicant: VisEra Technologies Company Limited, Hsin-Chu (TW)

(72) Inventors: Hao-Wei Liu, Zhubei (TW); Chia-Chien Hsieh, Hsinchu (TW); Sheng-Chuan Cheng, Hsin-Chu (TW); Ching-Chiang Wu, Zhubei (TW)

(73) Assignee: VISERA TECHNOLOGIES COMPANY LIMITED, Hsin-Chu (TW)

(*) Notice: Subject to any disclaimer, the term of this patent is extended or adjusted under 35 U.S.C. 154(b) by 459 days.

(21) Appl. No.: 17/379,150

(22) Filed: Jul. 19, 2021

(65) Prior Publication Data
US 2023/0020741 A1    Jan. 19, 2023

(51) Int. Cl.
*H01L 27/146* (2006.01)

(52) U.S. Cl.
CPC .. *H01L 27/14621* (2013.01); *H01L 27/14627* (2013.01); *H01L 27/14623* (2013.01); *H01L 27/1463* (2013.01)

(58) Field of Classification Search
CPC ......... H01L 27/14621; H01L 27/14627; H01L 27/14625; H01L 27/1463; H01L 27/14665; H01L 27/14623
See application file for complete search history.

(56) References Cited

U.S. PATENT DOCUMENTS

| | | | |
|---|---|---|---|
| 2016/0099271 A1* | 4/2016 | Chou | H01L 27/14621 438/70 |
| 2020/0280659 A1 | 9/2020 | Galor Gluskin | |
| 2020/0343286 A1 | 10/2020 | Ozawa | |
| 2020/0411578 A1* | 12/2020 | Tanaka | H01L 27/1463 |
| 2021/0028204 A1* | 1/2021 | Fujita | H01L 27/14623 |

FOREIGN PATENT DOCUMENTS

| | | |
|---|---|---|
| JP | 2015008343 A | 1/2015 |
| JP | 2015216186 A | 12/2015 |
| JP | 2016134617 A | 7/2016 |
| JP | 2016-219767 A | 12/2016 |
| JP | 2021005752 A | 1/2021 |
| JP | 2021086931 A | 6/2021 |
| KR | 20090023690 A | 3/2009 |
| KR | 10-2017-0007736 A | 1/2017 |

(Continued)

OTHER PUBLICATIONS

Office Action of JP Application No. 2021-207199, dated Mar. 29, 2022, 5 pages.

*Primary Examiner* — Patricia D Valenzuela
(74) *Attorney, Agent, or Firm* — Muncy, Geissler, Olds & Lowe, P.C.

(57) ABSTRACT

A solid-state image sensor is provided. The solid-state image sensor includes photoelectric conversion elements. The solid-state image sensor also includes a mosaic pattern layer disposed above the photoelectric conversion elements. The mosaic pattern layer includes an infrared-passing segment and color filter segments disposed on the periphery of the infrared-passing segment. The solid-state image sensor further includes a first condensing structure disposed on the mosaic pattern layer. The infrared-passing segment and the color filter segments share the first condensing structure.

20 Claims, 9 Drawing Sheets

(56) References Cited

FOREIGN PATENT DOCUMENTS

| TW | 201103130 A | 1/2011 |
|---|---|---|
| TW | 201126703 A | 8/2011 |
| TW | 201523860 A | 6/2015 |
| TW | 202013760 A | 4/2020 |
| WO | WO2017047215 A1 | 3/2017 |
| WO | WO-2018/174147 A1 | 9/2018 |

\* cited by examiner

SOLID-STATE IMAGE SENSOR

BACKGROUND

Technical Field

The embodiments of the present disclosure relate to image sensors, and in particular they relate to solid-state image sensors that include a mosaic pattern layer.

Description of the Related Art

Solid-state image sensors (e.g., charge-coupled device (CCD) image sensors, complementary metal-oxide semiconductor (CMOS) image sensors, and so on) are widely used in various image-capturing apparatuses such as digital still-image cameras, digital video cameras, and the like. The light-sensing portion in the solid-state image sensor may be formed at each of a plurality of pixels, and signal electric charges may be generated according to an amount of light received in the light-sensing portion. In addition, the signal electric charges generated in the light-sensing portion may be transmitted and amplified, whereby an image signal is obtained.

Recently, red pixels, green pixels, and blue pixels are often arranged as repeating Bayer patterns in the traditional solid-state image sensor. In some traditional solid-state image sensors, one or more color pixels (e.g., green pixel) may be replaced by one infrared pixel in one unit Bayer pattern. However, while pixel size continues to decrease, there are still various challenges in the design and manufacturing of image sensors.

For example, the infrared pixel may have low infrared sensitivity and low infrared signal-to-noise ratio (S/N) due to low infrared absorption when the pixel size is less than about 1 µm. One big micro lens may be used to enhance infrared sensitivity, but it may also cause high channel separation. The channel separation will make image detection difficult.

BRIEF SUMMARY

In some embodiments of the present disclosure, the solid-state image sensor includes a mosaic pattern layer. The mosaic pattern layer includes an infrared-passing segment and color filter segments with a specific arrangement, and a condensing structure (e.g., micro lens) is disposed on and covers the mosaic pattern layer, which may effectively enhance infrared sensitivity and also improve channel separation, thereby improving the quality of the image signal from the photoelectric conversion elements of the solid-state image sensors.

In accordance with some embodiments of the present disclosure, a solid-state image sensor is provided. The solid-state image sensor includes photoelectric conversion elements. The solid-state image sensor also includes a mosaic pattern layer disposed above the photoelectric conversion elements. The mosaic pattern layer includes an infrared-passing segment and color filter segments disposed on the periphery of the infrared-passing segment. The solid-state image sensor further includes a first condensing structure disposed on the mosaic pattern layer. The infrared-passing segment and the color filter segments share the first condensing structure.

In some embodiments, the mosaic pattern layer further includes transparent segments disposed at four corners of the infrared-passing segment.

In some embodiments, the transparent segments have a transmittance of more than 90% for light with a wavelength of greater than 10 nm and less than 1 mm.

In some embodiments, the infrared-passing segment, the color filter segments, and the transparent segments form an m×n array that has m×n pixel spaces, the infrared-passing segment occupies a p×q pixel space of the m×n array, m and n are positive integers equal to or greater than 3, and p and q are positive integers less than m and n.

In some embodiments, from the top view of the solid-state image sensor, the mosaic pattern layer has at least one symmetry axis.

In some embodiments, the symmetry axis partially overlaps one diagonal of the infrared-passing segment.

In some embodiments, each pixel space has a width in a range from 0.4 µm to 1 µm.

In some embodiments, the mosaic pattern layer further includes infrared-cutting segments disposed on the color filter segments and the transparent segments.

In some embodiments, the infrared-cutting segments are disposed between the photoelectric conversion elements and the color filter segments, or between the photoelectric conversion elements and the transparent segments.

In some embodiments, the infrared-cutting segments are disposed between the color filter segments and the first condensing structure, or between the transparent segments and the first condensing structure.

In some embodiments, the infrared-cutting segments have a transmittance of less than 5% for light with a wavelength of greater than 800 nm.

In some embodiments, the solid-state image sensor further includes a grid structure disposed between the infrared-passing segment and the color filter segments.

In some embodiments, the grid structure is further disposed between the color filter segments, or it is disposed between the color filter segments and the transparent segments.

In some embodiments, the grid structure is further disposed inside the infrared-passing segment.

In some embodiments, from the cross-sectional view of the solid-state image sensor, the grid structure is divided into grid segments, and each grid segment has a height in a range from 0.5 µm to 1.2 µm.

In some embodiments, each grid segment has a width in a range from 0.05 µm to 0.3 µm.

In some embodiments, the refractive index of the grid structure is in a range from 1.1 to 1.5.

In some embodiments, the first condensing structure corresponds to the infrared-passing segment, and the solid-state image sensor further includes second condensing structures disposed adjacent to the first condensing structure. The second condensing structures correspond to the color filter segments or the transparent segments.

In some embodiments, the thickness of the first condensing structure is different from the thickness of each of the second condensing structures.

In some embodiments, the infrared-passing segment has a transmittance of more than 80% for light with a wavelength of greater than 800 nm, and a transmittance of less than 5% for light with a wavelength of less than 750 nm.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION

Figure 1:
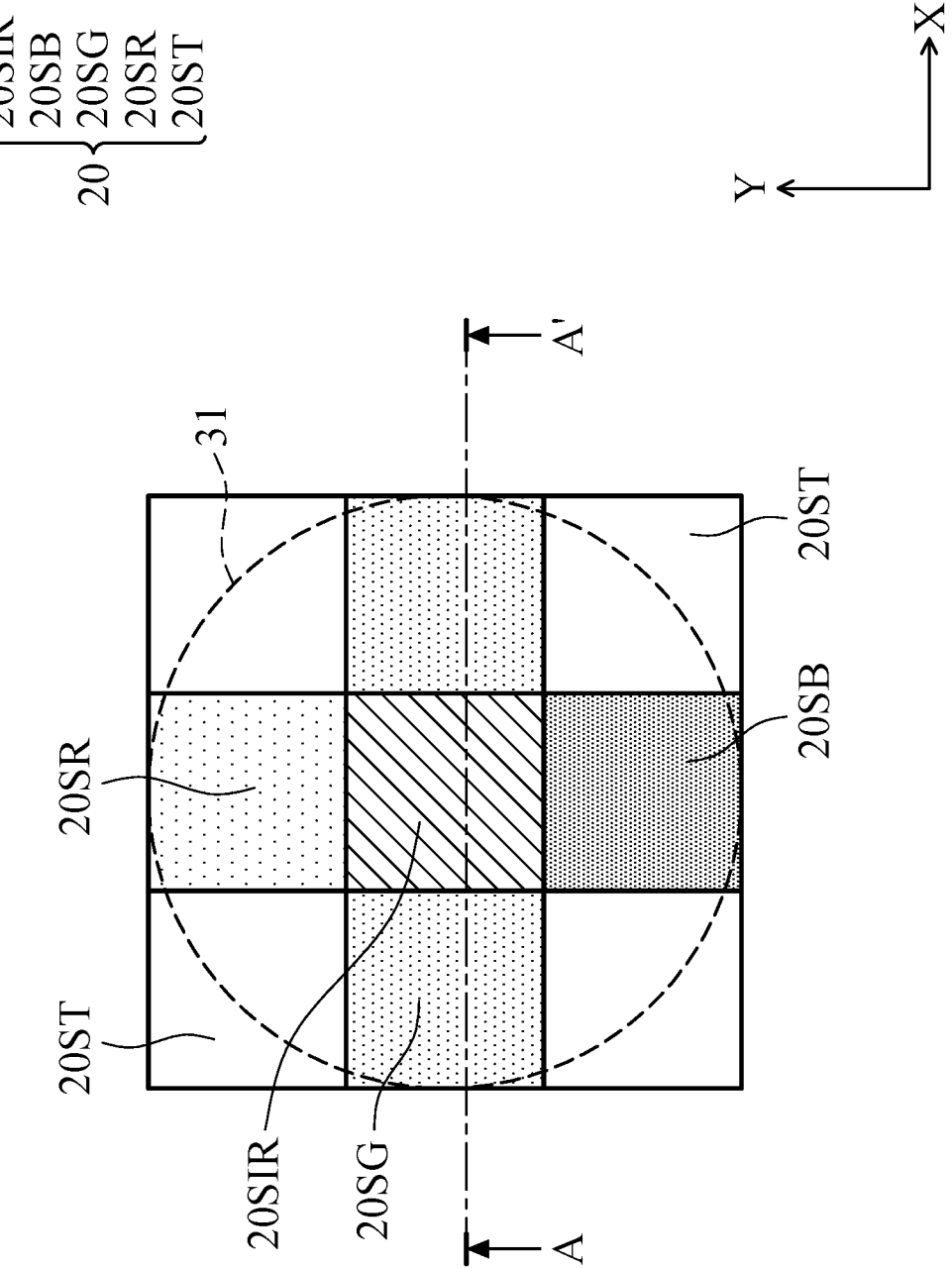
FIG. 1 is a top view illustrating a solid-state image sensor according to one embodiment of the present disclosure.

The following disclosure provides many different embodiments, or examples, for implementing different features of the subject matter provided. Specific examples of components and arrangements are described below to simplify the present disclosure. These are, of course, merely examples and are not intended to be limiting. For example, a first feature is formed on a second feature in the description that follows may include embodiments in which the first feature and second feature are formed in direct contact, and may also include embodiments in which additional features may be formed between the first feature and second feature, so that the first feature and second feature may not be in direct contact.

It should be understood that additional steps may be implemented before, during, or after the illustrated methods, and some steps might be replaced or omitted in other embodiments of the illustrated methods.

Furthermore, spatially relative terms, such as "beneath," "below," "lower," "on," "above," "upper" and the like, may be used herein for ease of description to describe one element or feature's relationship to other elements or features as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure, the terms "about," "approximately" and "substantially" typically mean +/−20% of the stated value, more typically +/−10% of the stated value, more typically +/−5% of the stated value, more typically +/−3% of the stated value, more typically +/−2% of the stated value, more typically +/−1% of the stated value and even more typically +1−0.5% of the stated value. The stated value of the present disclosure is an approximate value. That is, when there is no specific description of the terms "about," "approximately" and "substantially", the stated value includes the meaning of "about," "approximately" or "substantially".

Unless otherwise defined, all terms (including technical and scientific terms) used herein have the same meaning as commonly understood by one of ordinary skill in the art to which this disclosure belongs. It should be understood that terms such as those defined in commonly used dictionaries should be interpreted as having a meaning that is consistent with their meaning in the context of the relevant art and will not be interpreted in an idealized or overly formal sense unless expressly so defined in the embodiments of the present disclosure.

The present disclosure may repeat reference numerals and/or letters in following embodiments. This repetition is for the purpose of simplicity and clarity and does not in itself dictate a relationship between the various embodiments and/or configurations discussed.

Solid-state image sensors may be roughly classified into two groups in terms of the direction of light incident on a light receiving unit. One is the front-side illuminated (FSI) image sensors that receive light incident on the front side of a semiconductor substrate on which the wiring layer of the reading circuit is formed. Another is the back-side illuminated (BSI) image sensors that receive light incident on the back side of a semiconductor substrate on which no wiring layer is formed. For imaging a color image, color filter layers may be provided in the FSI and BSI image sensors.

Figure 2:
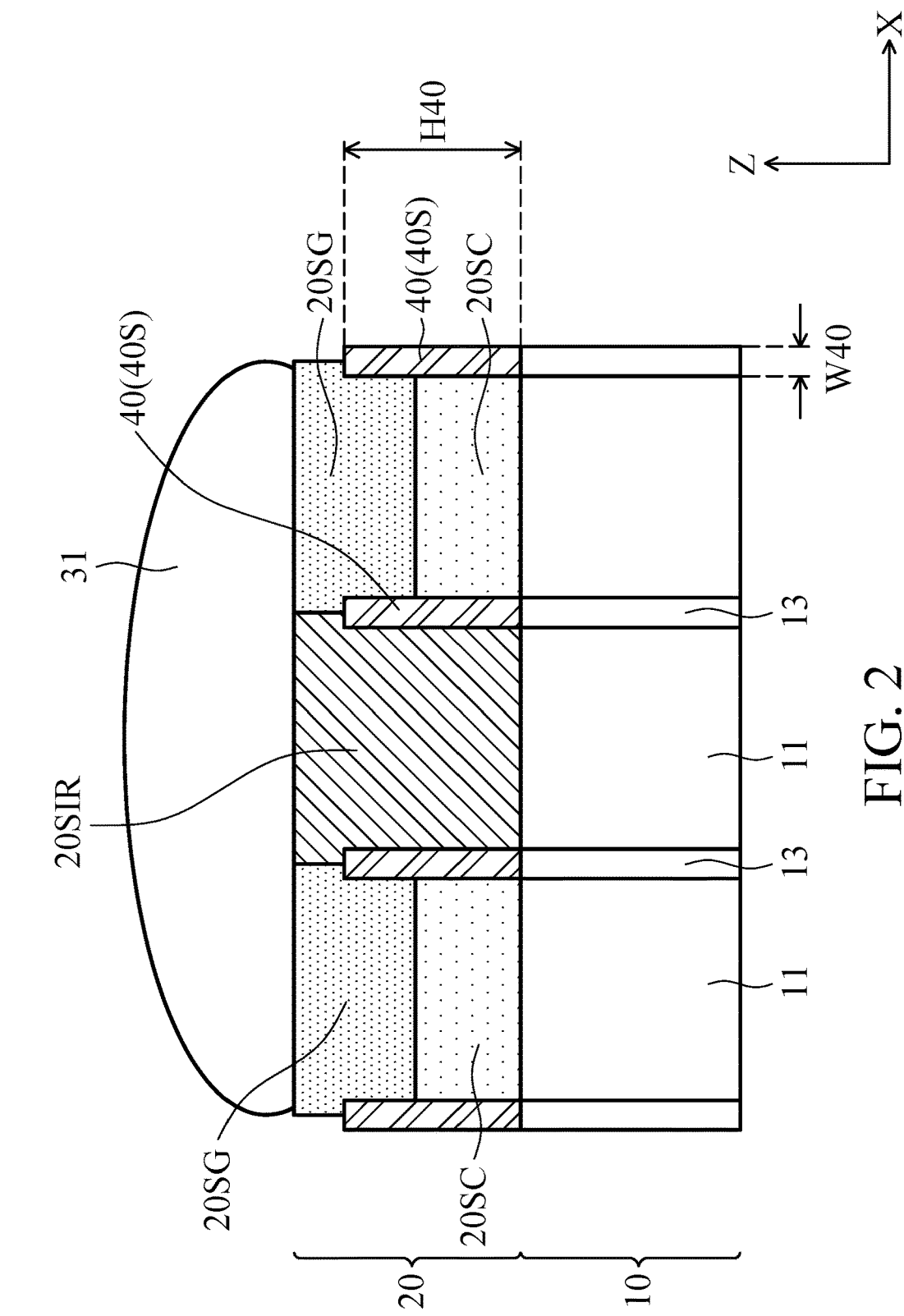
FIG. 2 is a cross-sectional view of the solid-state image sensor along line A-A' in FIG. 1.

FIG. 1 is a top view illustrating a solid-state image sensor 100 according to one embodiment of the present disclosure. FIG. 2 is a cross-sectional view of the solid-state image sensor 100 along line A-A' in FIG. 1. It should be noted that some components of the solid-state image sensor 100 have been omitted in FIG. 1 and FIG. 2 for the sake of brevity.

The solid-state image sensor 100 may be a complementary metal-oxide semiconductor (CMOS) image sensor or a charge coupled device (CCD) image sensor, but the present disclosures is not limited thereto. As shown in FIG. 2, the solid-state image sensor 100 includes a semiconductor substrate 10 which may be, for example, a wafer or a chip, but the present disclosure is not limited thereto. A plurality of photoelectric conversion elements 11, such as photodiodes, may be formed in the semiconductor substrate 10.

As shown in FIG. 2, the photoelectric conversion elements 11 in the semiconductor substrate 10 may be isolated from each other by isolation structures 13 such as shallow trench isolation (STI) regions or deep trench isolation (DTI) regions, but the present disclosure is not limited thereto. The isolation structures 13 may be formed in the semiconductor substrate 10 using etching process to form trenches and filling the trenches with an insulating or dielectric material. Incident lights may radiate onto one surface of the semiconductor substrate 10 and be received by the photoelectric conversion elements 11.

A wiring layer (not shown) may be formed on another surface of the semiconductor substrate 10, but the present disclosure is not limited thereto. The wiring layer may be an interconnect structure that includes multiple conductive lines and vias embedded in multiple dielectric layers, and may further include various electric circuits required for the solid-state image sensor 100.

The solid-state image sensor 100 may also include a high dielectric-constant (high-κ) film (not shown) and a buffer layer (not shown) formed on the surface (opposed to the wiring layer) of the semiconductor substrate 10 and covering the photoelectric conversion elements 11. For example, the high-κ film may include hafnium oxide ($HfO_2$), hafnium tantalum oxide (HfTaO), hafnium titanium oxide (HfTiO), hafnium zirconium oxide (HfZrO), tantalum pentoxide ($Ta_2O_5$), other suitable high-κ dielectric materials, or a combination thereof, but the present disclosure is not limited thereto. The high-κ film may have a high-refractive index and a light-absorbing ability. Moreover, the buffer layer may include silicon oxides, silicon nitrides, silicon oxynitrides, other suitable insulating materials, or a combination thereof, but the present disclosure is not limited thereto. The high-κ film may be formed by, for example, chemical vapor deposition (CVD), plasma enhanced chemical vapor deposition (PECVD), atomic layer deposition (ALD), or another deposition technique. The buffer layer may be formed by, for example, spin-on coating, chemical vapor deposition, flowable chemical vapor deposition (FCVD), plasma enhanced chemical vapor deposition, physical vapor deposition (PVD), or another deposition technique.

Referring to FIG. 1 and FIG. 2, in some embodiments, the solid-state image sensor 100 includes mosaic pattern layer 20 disposed above the photoelectric conversion elements 11. In some embodiments, the mosaic pattern layer 20 includes an infrared-passing segment 20SIR and color filter segments (e.g., the blue color filter segment 20SB, the green color filter segment 20SG, or the red color filter segment 20SR) disposed on the periphery of the infrared-passing segment 20SIR. For example, as shown in FIG. 1, the infrared-passing segment 20SIR is disposed on the center of the mosaic pattern layer 20, two green color filter segments 20SG are disposed on the left side and the right side of the infrared-passing segment 20SIR, and the red color filter segment 20SR and the blue color filter segment 20SB are respectively disposed on the upper side and the lower side of the infrared-passing segment 20SIR, but the present disclosure is not limited thereto.

In some embodiments, the infrared-passing segment 20SIR has a transmittance of more than about 80% for light with a wavelength of greater than about 800 nm, and a transmittance of less than about 5% for light with a wavelength of less than about 750 nm. Besides, the infrared-passing segment 20SIR may be formed by a deposition process, such as chemical vapor deposition (CVD), atomic layer deposition (ALD), molecular beam epitaxy (MBE), liquid phase epitaxy (LPE), the like, or a combination thereof, but the present disclosure is not limited thereto.

It should be noted that the blue color filter segment 20SB, the green color filter segment 20SG, or the red color filter segment 20SR may be replaced by other color filter segments. For example, the mosaic pattern layer 20 may also include a white color filter segment, a cyan color filter segment, a magenta color filter segment, or a yellow color filter segment, but the present disclosure is not limited thereto.

Referring to FIG. 1 and FIG. 2, in some embodiments, the solid-state image sensor 100 includes a condensing structure 31 disposed on the mosaic pattern layer 20 for condensing incident light. In some embodiments, the infrared-passing segment 20SIR and the color filter segments (e.g., the blue color filter segment 20SB, the green color filter segments 20SG, or the red color filter segment 20SR) share the condensing structure 31. For example, the center of the condensing structure 31 may correspond to the center of the infrared-passing segment 20SIR. In more detail, when the mosaic pattern layer 20 is in the central region of the solid-state image sensor 100 (e.g., FIG. 1), the central axis of the condensing structure 31 may overlap the central axis of the infrared-passing segment 20SIR, but the present disclosure is not limited thereto. When the mosaic pattern layer 20 is in the peripheral (or edge) region of the solid-state image sensor 100 (not shown), the central axis of the condensing structure 31 may have a shift with respect to the central axis of the infrared-passing segment 20SIR.

For example, the condensing structure 31 may include a transparent material, such as glass, epoxy resin, silicone resin, polyurethane, any other applicable material, or a combination thereof, but the present disclosure is not limited thereto. Moreover, the condensing structure 31 may be formed by a photoresist reflow method, a hot embossing method, any other applicable method, or a combination thereof. The steps of forming the condensing structure 31 may include a spin coating process, a lithography process, an etching process, any other applicable process, or a combination thereof, but the present disclosure is not limited thereto.

The condensing structure 31 may be a micro-lens structure, such as a semi-convex lens or a convex lens, but the present disclosure is not limited thereto. For example, the condensing structure 31 may be micro-pyramid structures (e.g., circular cone, quadrangular pyramid, and so on), or may be micro-trapezoidal structures (e.g., flat top cone, truncated square pyramid, and so on). Alternatively, the condensing structure 31 may be a gradient-index structure.

As shown in FIG. 1, in some embodiments, the mosaic pattern layer 20 further includes transparent segments 20ST disposed at four corners of the infrared-passing segment 20SIR. For example, the transparent segment 20ST may include a transparent material, such as glass, epoxy resin, silicone resin, polyurethane, any other applicable material, or a combination thereof, but the present disclosure is not limited thereto. In some embodiments, the transparent segment 20ST has a transmittance of more than about 90% for light with a wavelength of greater than about 10 nm and less than about 1 mm.

In some embodiments, the infrared-passing segment 20SIR, the color filter segments (e.g., the blue color filter segment 20SB, the green color filter segments 20SG, or the red color filter segment 20SR), and the transparent segments 20ST form an m×n array that has m×n pixel spaces, and the infrared-passing segment 20SIR occupies a p×q pixel space of the m×n array, wherein m and n are positive integers equal to or greater than 3, and p and q are positive integers less than m and n. For example, as shown in FIG. 1, the infrared-passing segment 20SIR, the blue color filter segment 20SB, the green color filter segments 20SG, the red color filter segment 20SR, and the transparent segments 20ST may form a 3×3 array that has 3×3 pixel spaces, and the infrared-passing segment 20SIR may occupy one (i.e., 1×1) pixel space of the 3×3 array, but the present disclosure is not limited thereto.

As shown in FIG. 1, each of the infrared-passing segment 20SIR, the blue color filter segment 20SB, the green color filter segments 20SG, the red color filter segment 20SR, and the transparent segments 20ST may occupy one pixel space, but the present disclosure is not limited thereto. Moreover, in some embodiments, the condensing structure 31 corresponds to the infrared-passing segment 20SIR, the blue color filter segment 20SB, the green color filter segments 20SG, the red color filter segment 20SR, and the transparent segments 20ST. That is, the infrared-passing segment 20SIR, the blue color filter segment 20SB, the green color filter segments 20SG, the red color filter segment 20SR, and the transparent segments 20ST may share the same condensing structure 31, but the present disclosure is not limited thereto.

In some embodiments, as shown in FIG. 2, the solid-state image sensor 100 includes a grid structure 40 disposed between the infrared-passing segment 20SIR and the color filter segments (e.g., the blue color filter segment 20SB, the green color filter segments 20SG, or the red color filter segment 20SR). In some embodiments, the grid structure 40 is further disposed between the color filter segments and the transparent segments 20ST (e.g., between the blue color filter segment 20SB and the transparent segment 20ST, between the green color filter segment 20SG and the transparent segment 20ST, or between the red color filter segment 20SR and the transparent segment 20ST).

The grid structure 40 may include a transparent dielectric material. In some embodiments, the refractive index of the grid structure 40 is in the range from about 1.1 to about 1.5. Moreover, the refractive index of the grid structure 40 may be lower than the refractive index of the blue color filter segment 20SB, the refractive index of the green color filter segment 20SG, and the refractive index of the red color filter segment 20SR, but the present disclosure is not limited thereto.

As shown in FIG. 2, the grid structure 40 may be divided into grid segments 40S from the cross-sectional view of the solid-state image sensor 100. In some embodiments, as shown in FIG. 2, each grid segment 40S has a height H40 in the range from about 0.5 µm to about 1.2 µm. In some embodiments, as shown in FIG. 2, each grid segment 40S has a width W40 in the range from about 0.05 µm to about 0.3 µm.

In some embodiments, as shown in FIG. 2, the mosaic pattern layer 20 further includes infrared-cutting segments 20SC disposed on the color filter segments (e.g., the green color filter segments 20SG). In some embodiments, the infrared-cutting segments 20SC are also disposed on the transparent segments 20ST (not shown in FIG. 2). The infrared-cutting segments 20SC may be a selective infrared filter which only cuts off infrared light with specific wavelength (e.g., a wavelength of greater than about 800 nm) or an infrared filter which cuts off infrared light with entire infrared band. In some embodiments, the infrared-cutting segments 20SC have a transmittance of less than 5% for light with a wavelength of greater than about 800 nm.

In some embodiments, as shown in FIG. 2, the infrared-cutting segments 20SC are disposed between the photoelectric conversion elements 11 and the green color filter segments 20SG. That is, the infrared-cutting segments 20SC may be disposed under the (green) color filter segments, but the present disclosure is not limited thereto. In some embodiments, the infrared-cutting segments 20SC are also disposed between the photoelectric conversion elements 11 and the transparent segments 20ST (not shown in FIG. 2). That is, the infrared-cutting segments 20SC may be disposed under the transparent segments 20ST. Moreover, in some embodiments, the grid structure 40 is disposed between the infrared-cutting segments 20SC.

Figure 3:
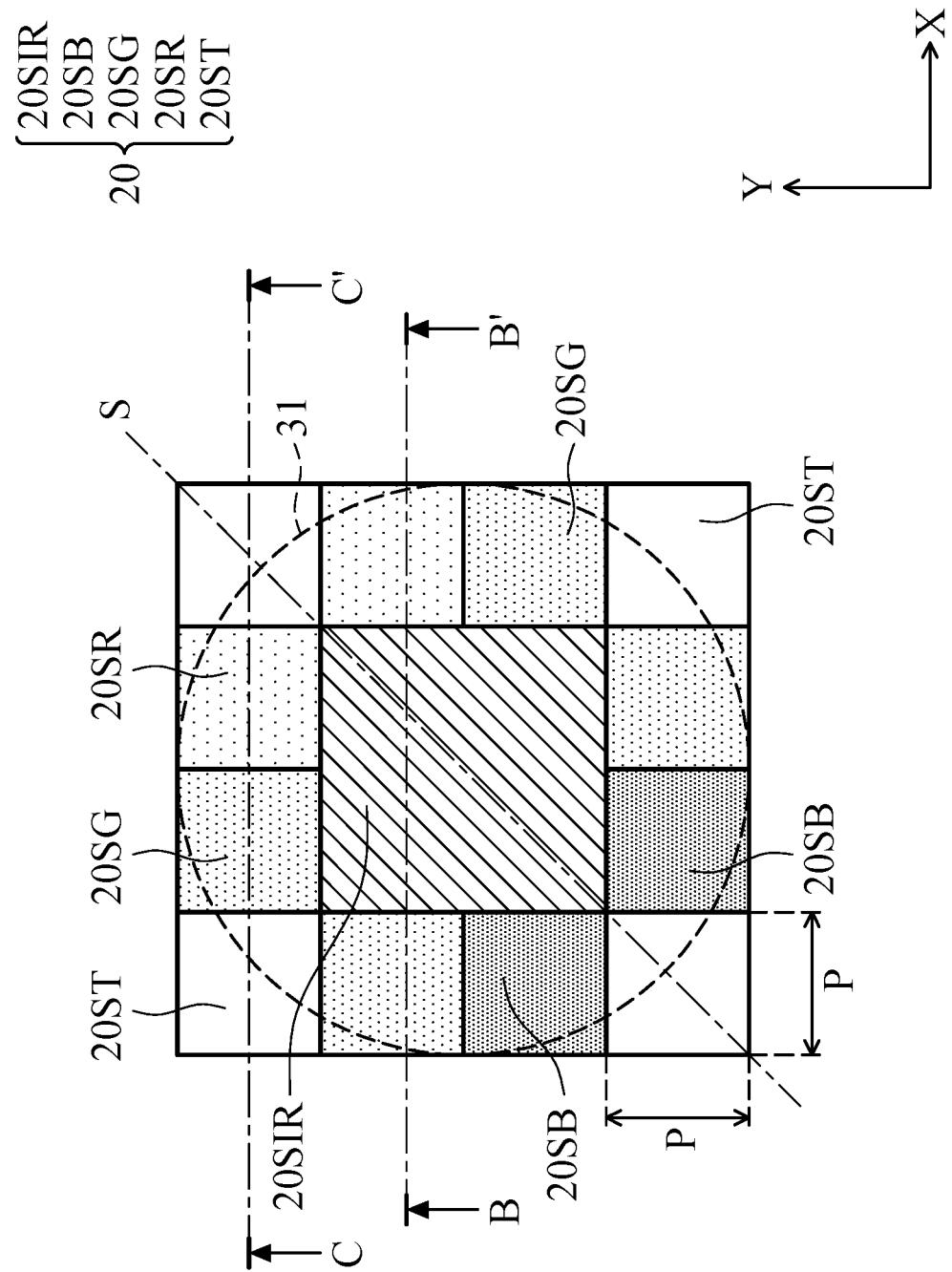
FIG. 3 is a top view illustrating a solid-state image sensor according to one embodiment of the present disclosure.
Figure 4:
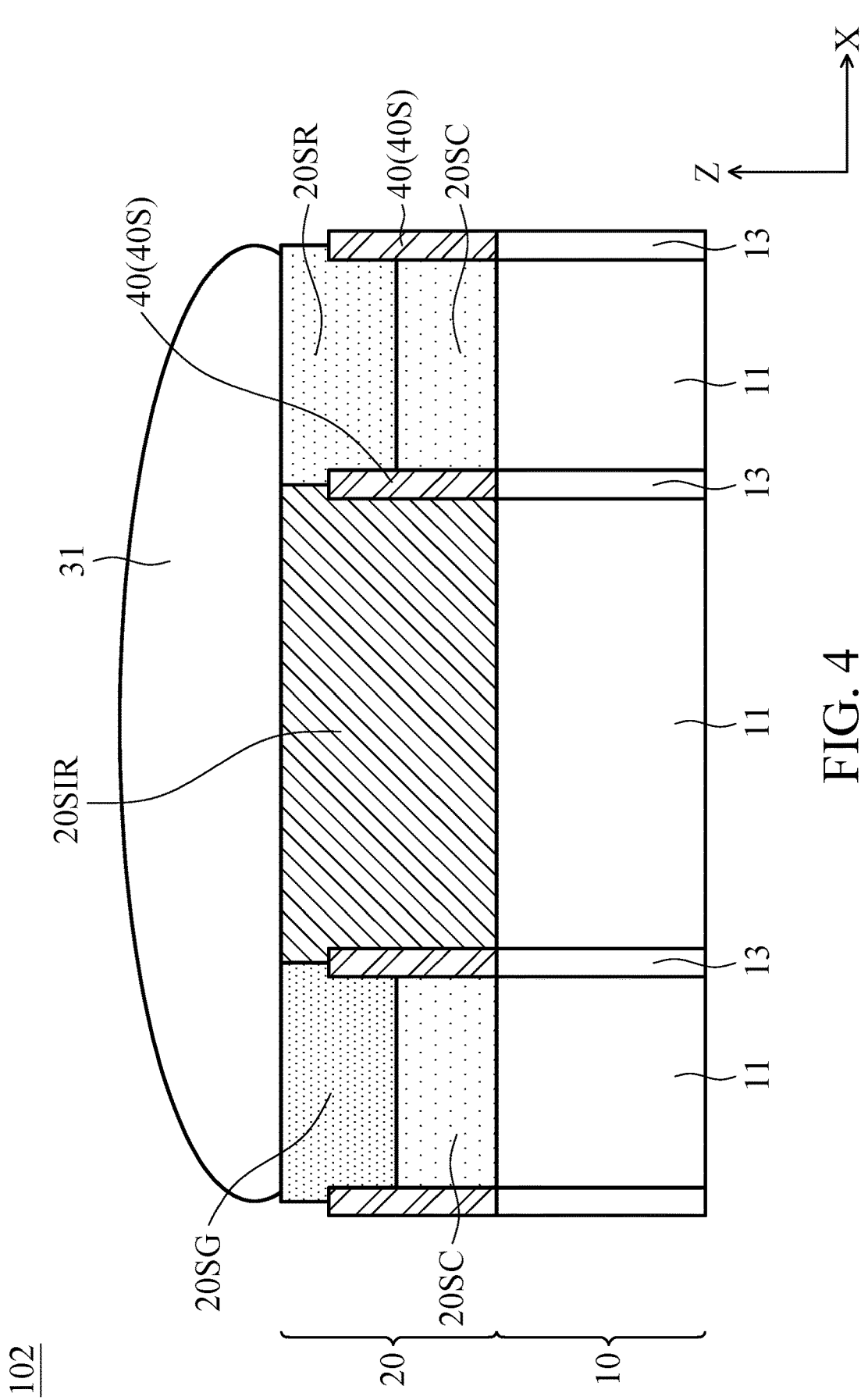
FIG. 4 is a cross-sectional view of the solid-state image sensor along line B-B' in FIG. 3.
Figure 5:
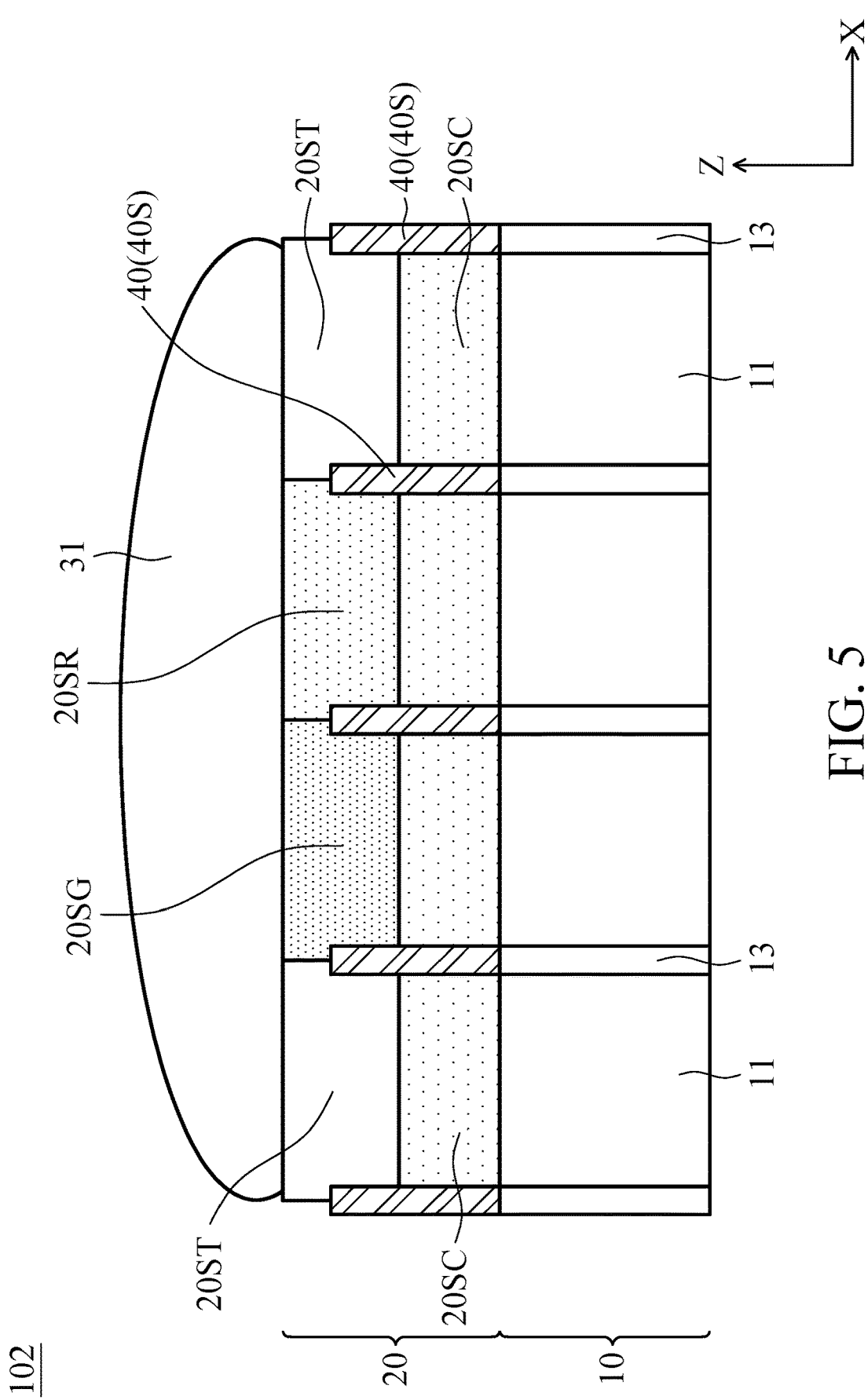
FIG. 5 is a cross-sectional view of the solid-state image sensor along line C-C' in FIG. 3.

FIG. 3 is a top view illustrating a solid-state image sensor 102 according to one embodiment of the present disclosure. FIG. 4 is a cross-sectional view of the solid-state image sensor 102 along line B-B' in FIG. 3. FIG. 5 is a cross-sectional view of the solid-state image sensor 102 along line C-C' in FIG. 3. It should be noted that some components of the solid-state image sensor 102 have been omitted in FIG. 3, FIG. 4 and FIG. 5 for the sake of brevity.

The solid-state image sensor 102 includes photoelectric conversion elements 11. The solid-state image sensor 102 also includes a mosaic pattern layer 20 disposed above the photoelectric conversion elements 11. The mosaic pattern layer 20 includes an infrared-passing segment 20SIR and blue color filter segments 20SB, green color filter segments 20SG, and red color filter segments 20SR disposed on the periphery of the infrared-passing segment 20SIR. The solid-state image sensor 102 further includes a condensing structure 31 disposed on the mosaic pattern layer 20. The infrared-passing segment 20SIR and the color filter segments (e.g., the blue color filter segments 20SB, the green color filter segments 20SG, or the red color filter segments 20SR) share the condensing structure 31.

Moreover, the mosaic pattern layer 20 of the solid-state image sensor 102 further includes transparent segments 20ST disposed at four corners of the infrared-passing segment 20SIR. For example, as shown in FIG. 3, the infrared-passing segment 20SIR, the blue color filter segments 20SB, the green color filter segments 20SG, the red color filter segments 20SR, and the transparent segments 20ST may form a 4×4 array that has 4×4 pixel spaces, and the infrared-passing segment 20SIR may occupy a 2×2 pixel space of the 4×4 array, but the present disclosure is not limited thereto.

In some embodiments, from the top view of the solid-state image sensor 102 shown in FIG. 3, each pixel space in the 4×4 array has a width P in the range from about 0.4 µm to about 1 µm. Here, the width P may be defined as the width of each pixel space along X-direction or Y-direction. Moreover, the width of each pixel space along X-direction and Y-direction may be different.

In more detail, from the top view of the solid-state image sensor 102 as shown in FIG. 3, the green color filter segment 20SG and the red color filter segment 20SR may be disposed on the upper side of the infrared-passing segment 20SR, the blue color filter segment 20SB and the green color filter segment 20SG may be disposed on the lower side of the infrared-passing segment 20SIR, the green color filter segment 20SG and the blue color filter segment 20SB may be disposed on the left side of the infrared-passing segment 20SIR, and the red color filter segment 20SR and the green color filter segment 20SG may be disposed on the right side of the infrared-passing segment 20SIR, but the present disclosure is not limited thereto.

In some embodiments, from the top view of the solid-state image sensor 102, the mosaic pattern 20 has at least one symmetry axis (e.g., the symmetry axis S shown in FIG. 3). For example, as shown in FIG. 3, two red color filter segments 20SR may be symmetrical to each other with respect to the symmetry axis S, four green color filter segments 20SG may be symmetrical to each other with respect to the symmetry axis S, and two blue color filter segments 20SB may be symmetrical to each other with respect to the symmetry axis S, but the present disclosure is not limited thereto.

In some embodiments, as shown in FIG. 3, the symmetry axis S partially overlaps one diagonal of the infrared-passing segment 20SIR. In some other embodiments, the mosaic pattern 20 has two or more symmetry axes, and these symmetry axes may not overlap any diagonal of the infrared-passing segment 20SIR, which depends on the arrangement of the color filter segments.

In some embodiments, the solid-state image sensor 102 includes a grid structure 40 disposed between the infrared-passing segment 20SIR and the green color filter segment 20SG, between the infrared-passing segment 20SIR and the red color filter segment 20SR as shown in FIG. 4, and between the green color filter segment 20SG and the red color filter segment 20SR, between the green color filter segment 20SG and transparent segment 20ST, and between the red color filter segment 20SR and transparent segment 20ST as shown in FIG. 5. Moreover, the grid structure 40 is disposed between the infrared-cutting segments 20SC.

Figure 6:
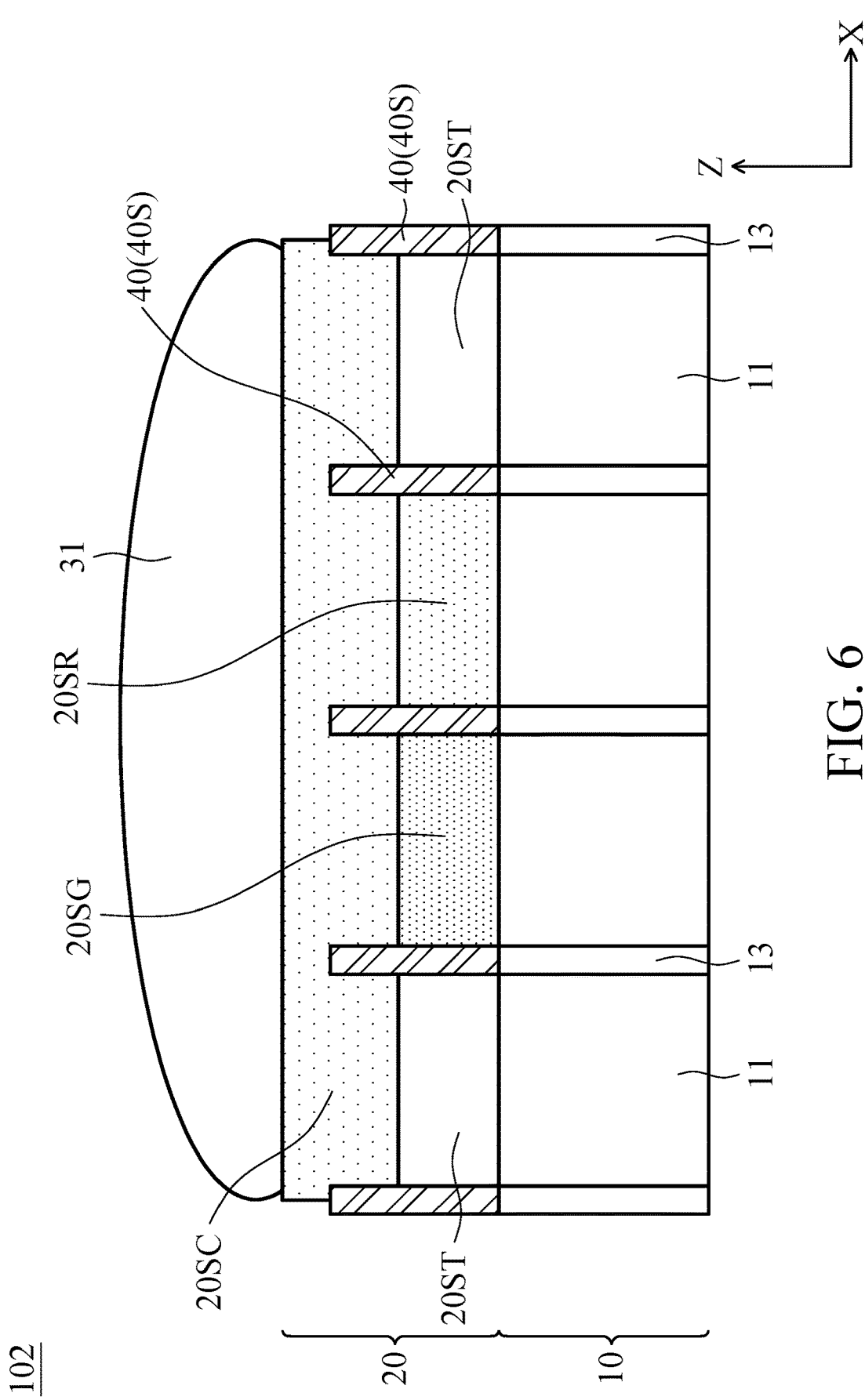
FIG. 6 is a cross-sectional view of the solid-state image sensor along line C-C' in FIG. 3 according to another embodiment of the present disclosure.
Figure 7:
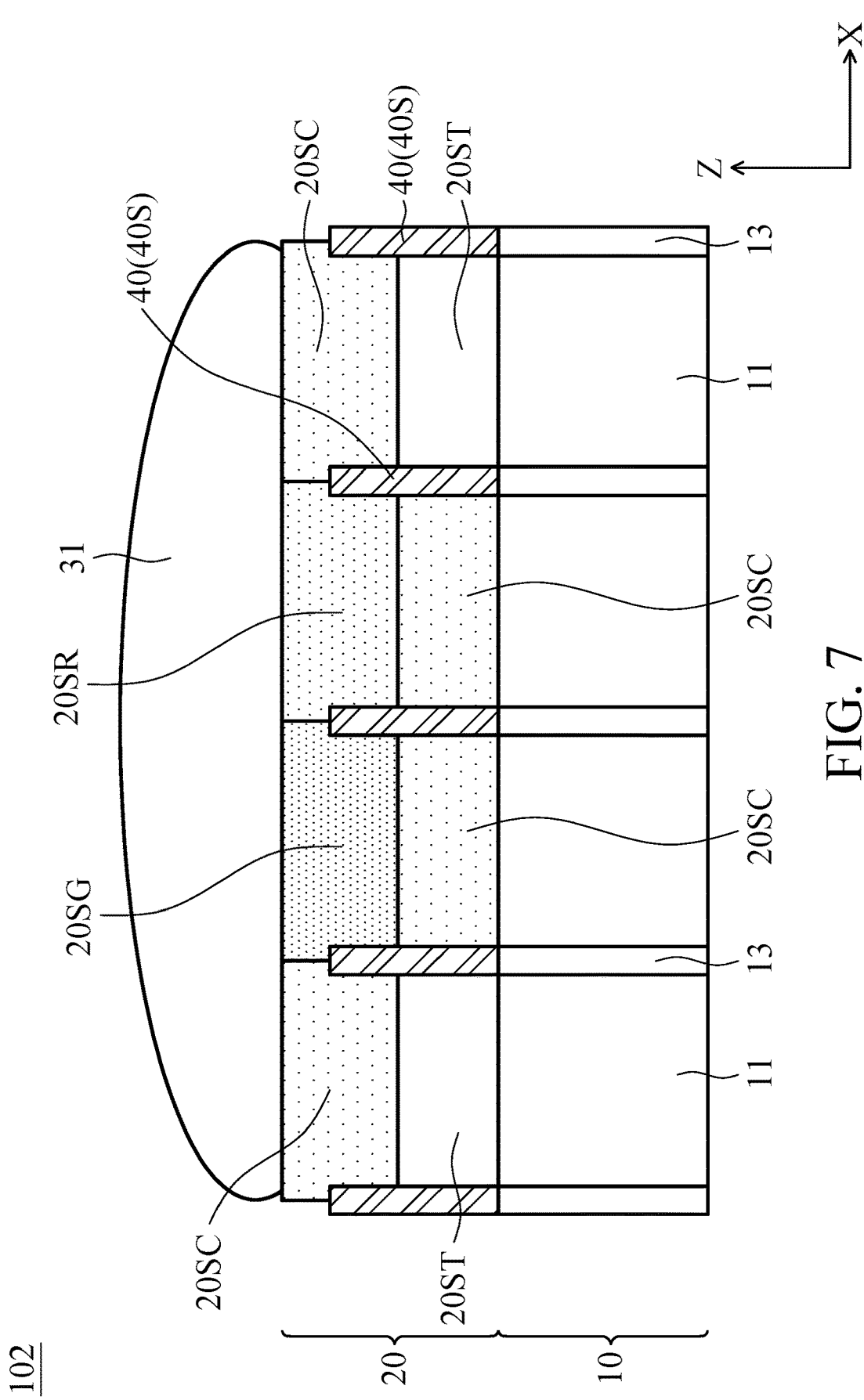
FIG. 7 is a cross-sectional view of the solid-state image sensor along line C-C' in FIG. 3 according to still another embodiment of the present disclosure.

FIG. 6 is a cross-sectional view of the solid-state image sensor 102 along line C-C' in FIG. 3 according to another embodiment of the present disclosure. FIG. 7 is a cross-sectional view of the solid-state image sensor 102 along line C-C' in FIG. 3 according to still another embodiment of the present disclosure. That is, the cross-sectional view of the solid-state image sensor 102 shown in FIG. 6 or FIG. 7 may replace the cross-sectional view of the solid-state image sensor 102 shown in FIG. 5.

In some embodiments, as shown in FIG. 6, the infrared-cutting segments 20SC are disposed between the green color filter segment 20SG and the condensing structure 31, between the red color filter segment 20SR and the condensing structure 31, and between the transparent segments 20ST and the condensing structure 31. That is, the infrared-cutting segments 20SC may be disposed above the color filter segments and the transparent segments 20ST. In other words, the color filter segments and the transparent segments 20ST may be disposed between the photoelectric conversion elements 11 and the infrared-cutting segments 20SC, but the present disclosure is not limited thereto.

In some embodiments, as shown in FIG. 7, the infrared-cutting segments 20SC are disposed between the photoelectric conversion elements 11 and the green color filter segments 20SG, and between the photoelectric conversion elements 11 and the red color filter segments 20SR. That is, the infrared-cutting segments 20SC may be disposed under the green color filter segments 20SG and the red color filter segments 20SR, but the present disclosure is not limited thereto. Moreover, the infrared-cutting segments 20SC are disposed between the transparent segments 20ST and the condensing structure 31. That is, the transparent segments 20ST may be disposed between the photoelectric conversion elements 11 and the infrared-cutting segments 20SC, but the present disclosure is not limited thereto.

Figure 8:
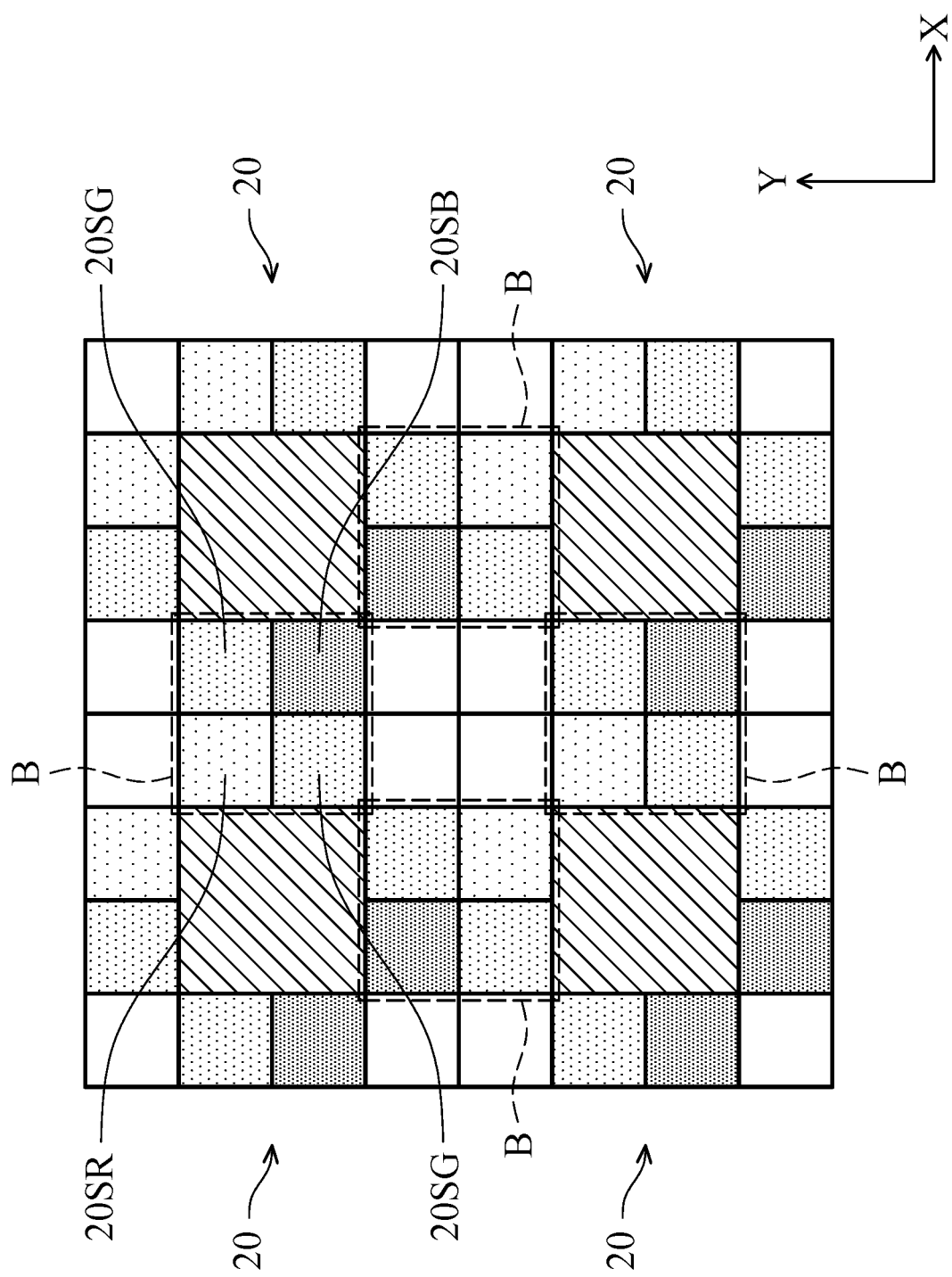
FIG. 8 is another top view illustrating the solid-state image sensor according to one embodiment of the present disclosure.

FIG. 8 is another top view illustrating the solid-state image sensor 102 according to one embodiment of the present disclosure. In some embodiments, the solid-state image sensor 102 includes a plurality of mosaic pattern layer 20 arranged together. For example, FIG. 8 illustrates four mosaic pattern layers 20 disposed adjacent to each other along X-direction and Y-direction, but the present disclosure is not limited thereto. There may be more than four mosaic pattern layer 20 arranged together in the solid-state image sensor 102. As shown in FIG. 8, blue color filter segments 20SB, green color filter segments 20SG, and red color filter segments 20SR (in different mosaic pattern layers 20) may form a plurality of Bayer patterns B, but the present disclosure is not limited thereto.

Figure 9:
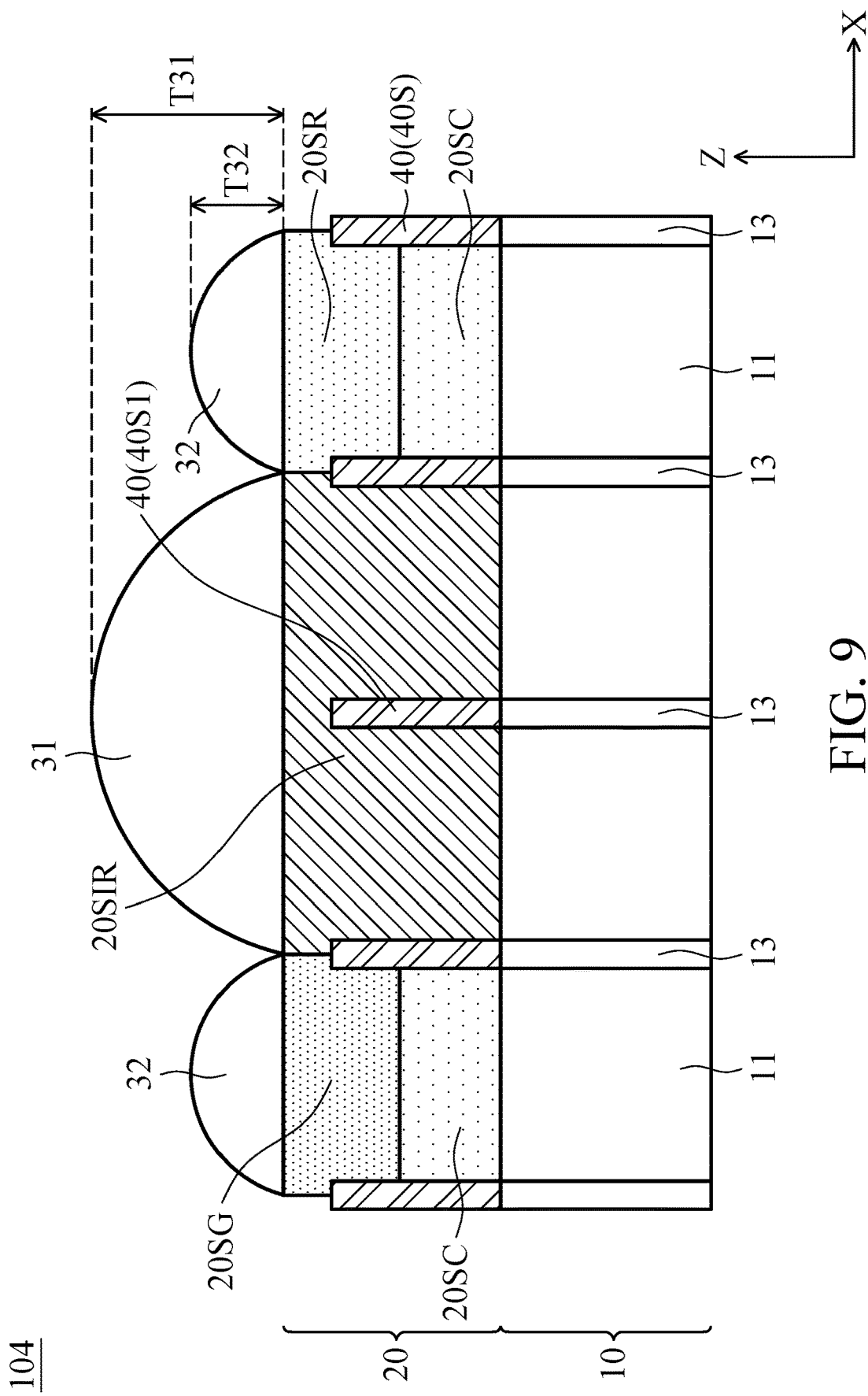
FIG. 9 is a cross-sectional view illustrating a solid-state image sensor according to another embodiment of the present disclosure.

FIG. 9 is a cross-sectional view illustrating a solid-state image sensor 104 according to another embodiment of the present disclosure. In some embodiments, as shown in FIG. 9, the grid structure 40 is further disposed inside the infrared-passing segment 20SIR (i.e., the grid segment 40S1 shown in FIG. 9).

In some embodiments, as shown in FIG. 9, the condensing structure 31 corresponds to the infrared-passing segment 20SIR, and the solid-state image sensor 104 further includes condensing structures 32 disposed adjacent to the condensing structure 31. In some embodiments, as shown in FIG. 9, the condensing structures 32 correspond to the color filter segments (e.g., the green color filter segment 20SG and the red color filter segment 20SR). Moreover, the condensing structures 32 correspond to the transparent segments 20ST (not shown in FIG. 9).

In some embodiments, the thickness T31 of the condensing structure 31 is different from the thickness T32 of each condensing structure 32. For example, as shown in FIG. 9, the thickness T31 of the condensing structure 31 may be greater than the thickness T32 of each condensing structure 32 for better infrared sensitivity and signal-to-noise ratio, but the present disclosure is not limited thereto. In some other examples (not shown), the thickness T31 of the condensing structure 31 may be less than the thickness T32 of each condensing structure 32, which may be adjusted depending on actual needs.

In summary, the solid-state image sensor according to some embodiments of the present disclosure includes a mosaic pattern layer. The mosaic pattern layer includes an infrared-passing segment and color filter segments with a specific arrangement, and a condensing structure is disposed on and covers the mosaic pattern layer, which may effectively enhance infrared sensitivity and also improve channel separation, thereby improving the quality of the image signal from the photoelectric conversion elements of the solid-state image sensors.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure. Therefore, the scope of protection should be determined through the claims. In addition, although some embodiments of the present disclosure are disclosed above, they are not intended to limit the scope of the present disclosure.

Reference throughout this specification to features, advantages, or similar language does not imply that all of the features and advantages that may be realized with the present disclosure should be or are in any single embodiment of the present disclosure. Rather, language referring to the features and advantages is understood to mean that a specific feature, advantage, or characteristic described in connection with an embodiment is included in at least one embodiment of the present disclosure. Thus, discussions of the features and advantages, and similar language, throughout this specification may, but do not necessarily, refer to the same embodiment.

Furthermore, the described features, advantages, and characteristics of the disclosure may be combined in any suitable manner in one or more embodiments. One skilled in the relevant art will recognize, in light of the description herein, that the disclosure can be practiced without one or more of the specific features or advantages of a particular embodiment. In other instances, additional features and advantages may be recognized in certain embodiments that may not be present in all embodiments of the present disclosure.

What is claimed is:
1. A solid-state image sensor, comprising:
photoelectric conversion elements;
a mosaic pattern layer disposed above the photoelectric conversion elements, wherein the mosaic pattern layer comprises an infrared-passing segment and color filter segments disposed on the periphery of the infrared-passing segment; and a first condensing structure disposed on the mosaic pattern layer, wherein the infrared-passing segment and the color filter segments share the first condensing structure, and a center of the first condensing structure corresponds to a center of the infrared-passing segment.

2. The solid-state image sensor as claimed in claim 1, wherein the mosaic pattern layer further comprises transparent segments disposed at four corners of the infrared-passing segment.

3. The solid-state image sensor as claimed in claim 2, wherein the transparent segments have a transmittance of more than 90% for light with a wavelength of greater than 10 nm and less than 1 mm.

4. The solid-state image sensor as claimed in claim 2, wherein the infrared-passing segment, the color filter segments, and the transparent segments form an m×n array that has m×n pixel spaces, the infrared-passing segment occupies a p×q pixel space of the m×n array, m and n are positive integers equal to or greater than 3, and p and q are positive integers less than m and n.

5. The solid-state image sensor as claimed in claim 4, wherein from a top view of the solid-state image sensor, the mosaic pattern layer has at least one symmetry axis.

6. The solid-state image sensor as claimed in claim 5, wherein the at least one symmetry axis partially overlaps one diagonal of the infrared-passing segment.

7. The solid-state image sensor as claimed in claim 4, wherein each of the m×n pixel spaces has a width in a range from 0.4 μm to 1 μm.

8. The solid-state image sensor as claimed in claim 2, wherein the mosaic pattern layer further comprises infrared-cutting segments disposed on the color filter segments and the transparent segments.

9. The solid-state image sensor as claimed in claim 8, wherein the infrared-cutting segments are disposed between the photoelectric conversion elements and the color filter segments, or between the photoelectric conversion elements and the transparent segments.

10. The solid-state image sensor as claimed in claim 8, wherein the infrared-cutting segments are disposed between the color filter segments and the first condensing structure, or between the transparent segments and the first condensing structure.

11. The solid-state image sensor as claimed in claim 8, wherein the infrared-cutting segments have a transmittance of less than 5% for light with a wavelength of greater than 800 nm.

12. The solid-state image sensor as claimed in claim 2, further comprising:

a grid structure disposed between the infrared-passing segment and the color filter segments.

13. The solid-state image sensor as claimed in claim 12, wherein the grid structure is further disposed between the color filter segments, or between the color filter segments and the transparent segments.

14. The solid-state image sensor as claimed in claim 12, wherein the grid structure is further disposed inside the infrared-passing segment.

15. The solid-state image sensor as claimed in claim 12, wherein from a cross-sectional view of the solid-state image sensor, the grid structure is divided into grid segments, and each of the grid segments has a height in a range from 0.5 μm to 1.2 μm.

16. The solid-state image sensor as claimed in claim 15, wherein each of the grid segments has a width in a range from 0.05 μm to 0.3 μm.

17. The solid-state image sensor as claimed in claim 12, wherein a refractive index of the grid structure is in a range from 1.1 to 1.5.

18. The solid-state image sensor as claimed in claim 2, wherein the first condensing structure corresponds to the infrared-passing segment, and the solid-state image sensor further comprises:

second condensing structures disposed adjacent to the first condensing structure, wherein the second condensing structures correspond to the color filter segments or the transparent segments.

19. The solid-state image sensor as claimed in claim 18, wherein a thickness of the first condensing structure is different from than a thickness of each of the second condensing structures.

20. The solid-state image sensor as claimed in claim 1, wherein the infrared-passing segment has a transmittance of more than 80% for light with a wavelength of greater than 800 nm, and a transmittance of less than 5% for light with a wavelength of less than 750 nm.

* * * * *